(12) United States Patent
Huo et al.

(10) Patent No.: US 8,283,719 B2
(45) Date of Patent: Oct. 9, 2012

(54) NONVOLATILE MEMORY DEVICE HAVING A FIXED CHARGE LAYER

(75) Inventors: ZongLiang Huo, Suwon-si (KR); Myoungbum Lee, Seoul (KR); Kihyun Hwang, Seongnam-si (KR); Seungmok Shin, Yongin-si (KR); Sunjung Kim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 111 days.

(21) Appl. No.: 12/894,615

(22) Filed: Sep. 30, 2010

(65) Prior Publication Data

US 2011/0101443 A1    May 5, 2011

(30) Foreign Application Priority Data

Sep. 30, 2009    (KR) .................. 10-2009-0093292

(51) Int. Cl.
*H01L 29/792*    (2006.01)
*H01L 29/788*    (2006.01)
*H01L 29/76*    (2006.01)

(52) U.S. Cl. .. 257/324; 257/315; 257/329; 257/E29.309
(58) Field of Classification Search .................. 257/324, 257/315, 329, E29.309; 365/178, 185.17
See application file for complete search history.

(56) References Cited

U.S. PATENT DOCUMENTS

| | | | | |
|---|---|---|---|---|
| 8,089,120 | B2* | 1/2012 | Tanaka et al. ................ | 257/324 |
| 2006/0138478 | A1* | 6/2006 | Buh et al. ..................... | 257/288 |
| 2007/0252201 | A1 | 11/2007 | Kito et al. | |
| 2008/0170438 | A1* | 7/2008 | Orimoto et al. .......... | 365/185.17 |
| 2008/0180994 | A1 | 7/2008 | Katsumata et al. | |
| 2008/0315291 | A1 | 12/2008 | Kito et al. | |
| 2010/0059811 | A1* | 3/2010 | Sekine et al. ................ | 257/324 |
| 2011/0084331 | A1* | 4/2011 | Tanaka et al. ................ | 257/324 |

FOREIGN PATENT DOCUMENTS

| | | |
|---|---|---|
| JP | 06-338602 A | 12/1994 |
| JP | 2008-171839 A | 7/2008 |
| JP | 2009-004510 A | 1/2009 |
| KR | 10-2008-0112131 A | 12/2008 |

OTHER PUBLICATIONS

Buh, G.H., et al., "Interface States as an Active Component for 20 nm Gate-Length Planar MOSFET with ElectroStatic Channel Extension (ESCE)", IEEE, pp. 832-835 ( © 2005).
Sasaki, Y., et al., "Conformal Doping for FinFETs and Precise Controllable Shallow Doping for Planar FET Manufacturing by a Novel $B_2H_6$/Helium Self-Regulatory Plasma Doping Process", IEEE, pp. 917-920, ( © 2008).
Yeh, Ching-Fa, et al., "The Performance and Reliability of Self-Induced Lightly-Doped-Drain Polysilicon Thin Film Transistors", IEDM'94, 8-4-13-8-4-16 (1994).

* cited by examiner

*Primary Examiner* — Shouxiang Hu
(74) *Attorney, Agent, or Firm* — Lee & Morse, P.C.

(57) ABSTRACT

Provided are a nonvolatile memory device and a method for fabricating the same. The nonvolatile memory device may include a stacked structure, a semiconductor pattern, an information storage layer, and a fixed charge layer. The stacked structure may be disposed over a semiconductor substrate. The stacked structure may include conductive patterns and interlayer dielectric patterns alternately stacked therein. The semiconductor pattern may be connected to the semiconductor substrate by passing through the stacked structure. The information storage layer may be disposed between the semiconductor pattern and the conductive patterns. The fixed charge layer may be disposed between the semiconductor pattern and the interlayer dielectric pattern. The fixed charge layer may include fixed charges. Electrical polarity of the fixed charges may be equal to electrical polarity of majority carriers of the semiconductor pattern.

10 Claims, 14 Drawing Sheets

NONVOLATILE MEMORY DEVICE HAVING A FIXED CHARGE LAYER

BACKGROUND

1. Field

The present disclosure herein relates to a nonvolatile memory device and a method for fabricating the same, and more particularly, to a nonvolatile memory device having a three-dimensional structure and a method for fabricating the same.

2. Description of the Related Art

The degree of integration of semiconductor devices needs to be increased to meet consumer demands for excellent performance and low prices. In semiconductor memory devices, since the degree of integration is an important factor affecting the price of products, increasing the degree of integration is of particular importance. In typical two dimensional or planar semiconductor devices, since the degree of integration is mainly determined by the area occupied by a unit memory cell, the degree of integration is greatly affected by the level of technologies of forming a micro pattern. Further, miniaturization of patterns requires highly expensive equipment. The degree of integration of two-dimensional semiconductor memory devices is being steadily increased, but there are limits.

Three-dimensional semiconductor memory devices including three-dimensionally arranged memory cells are being proposed. Processing technologies that can reduce the manufacturing cost per bit to less than that of the two-dimensional semiconductor memory device and achieve reliable product characteristics are required for mass production of three-dimensional semiconductor memory devices.

SUMMARY

Embodiments are therefore directed to nonvolatile memory devices and methods for fabricating such nonvolatile memory devices, which substantially overcome one or more of the problems due to the limitations and disadvantages of the related art.

It is therefore a feature of an embodiment to provide a non-volatile memory devices having a three-dimensional structure with improved electrical characteristics relative to the comparable conventional art.

It is therefore a separate feature of an embodiment to provide a method for fabricating a NAND-type nonvolatile memory device having a three-dimensional structure with improved electrical characteristics relative to the comparable conventional art.

It is therefore a separate feature of an embodiment to provide a nonvolatile memory device and a method for fabricating such a memory device in which a channel connection region induced by a fixed charge layer is provided to the source/drain regions of memory cells having a vertical channel such that the channel regions of the vertical adjacent memory cells may be inhibited from being electrically disconnected when the nonvolatile memory device is operated.

It is therefore a separate feature of an embodiment to provide a nonvolatile memory device and a method for fabricating such a memory device in which the resistance of the source/drain region may be reduced in the memory cells relative to comparable conventional devices. Thus, a current can be increased in the memory cells storing data.

It is therefore a separate feature of an embodiment to provide a nonvolatile memory device and a method for fabricating such a memory device in which, due to an interaction between fixed charges in the fixed charge layer and charges stored in the charge storage layer, diffusion of the charges stored in the charge storage layer of the memory device may be inhibited.

At least one of the above and other features and advantages may be realized by providing a nonvolatile memory device including a stacked structure on a semiconductor substrate, the stacked structure comprising conductive patterns and interlayer dielectric patterns alternately stacked therein, a semiconductor pattern connected to the semiconductor substrate by passing through the stacked structure, a data storage layer between the semiconductor pattern and the conductive patterns, and a fixed charge layer between the semiconductor pattern and the interlayer dielectric patterns, the fixed charge layer including fixed charges, wherein electrical polarity of the fixed charges is equal to electrical polarity of majority carriers of the semiconductor pattern.

The semiconductor pattern may include a p-type semiconductor material, and the fixed charge layer may include elements generating positive fixed charges.

The elements generating the positive fixed charges include nitrogen (N), hydrogen (H), hafnium (HF), and/or zirconium (Zr).

The fixed charge layer may include silicon nitride (SiN), silicon oxynitride (SiON), hafnium oxide, and/or zirconium oxide.

The semiconductor pattern may include an n-type semiconductor material, and the fixed charge layer may include elements generating negative fixed charges.

The elements generating the negative fixed charges may include fluorine (F) and/or aluminum (Al).

The fixed charge layer may include aluminum oxide and/or aluminum oxynitride.

The semiconductor pattern may include a channel region adjacent to the conductive pattern and a channel connection region adjacent to the fixed charge layer, and a number of majority carriers in the channel connection region may be smaller than a number of majority carriers in the channel region.

The data storage layer may extend on top surfaces and bottom surfaces of the conductive pattern.

The interlayer dielectric patterns may include an insulating material having a dielectric constant smaller than a dielectric constant of a material of the fixed charge layer.

At least one of the above and other features and advantages may be realized by providing a method for fabricating a nonvolatile memory device, including alternately stacking a plurality of first material layers and a plurality of second material layers on a semiconductor substrate, forming first openings passing through the first and second material layers and exposing the semiconductor substrate, forming a fixed charge layer on an inner wall of the first openings, the fixed charge layer being adapted to generate fixed charges, forming semiconductor patterns in the first openings, the semiconductor patterns extending from the semiconductor substrate to contact the fixed charge layer, forming a second opening passing through the first and second material layers between the first openings, removing the first material layers and portions of the fixed charge layer contacting the first material layers to form gate regions exposing portions of the semiconductor patterns and interlayer dielectric patterns, forming a data storage layer contacting the portions of the semiconductor patterns in the gate regions, respectively, and forming conductive patterns on the data storage layer in the gate regions.

The semiconductor pattern may include a p-type semiconductor material, and the fixed charge layer may include elements generating positive fixed charges.

The elements generating the positive fixed charges may include nitrogen (N), hydrogen (H), hafnium (HF), and/or zirconium (Zr).

The semiconductor pattern may include an n-type semiconductor material, and the fixed charge layer may include elements generating negative fixed charges.

The elements generating the negative fixed charges may include fluorine (F) and/or aluminum (Al).

Forming the fixed charge layer may include performing a plasma process or an annealing process using a process gas including elements adapted to generate the fixed charges.

Forming the fixed charge layer may include depositing an insulating layer including the elements adapted to generate the fixed charges.

Forming the fixed charge layer may include ion-implanting elements generating the fixed charge.

Forming the data storage layer may include conformally forming the data storage layer along surfaces of the semiconductor patterns and surfaces of the second material layers that are exposed by the gate regions.

Forming the conductive patterns may include forming a conductive layer filling the second opening and the gate regions, and patterning the conductive layer to form the conductive patterns in the gate regions, respectively.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
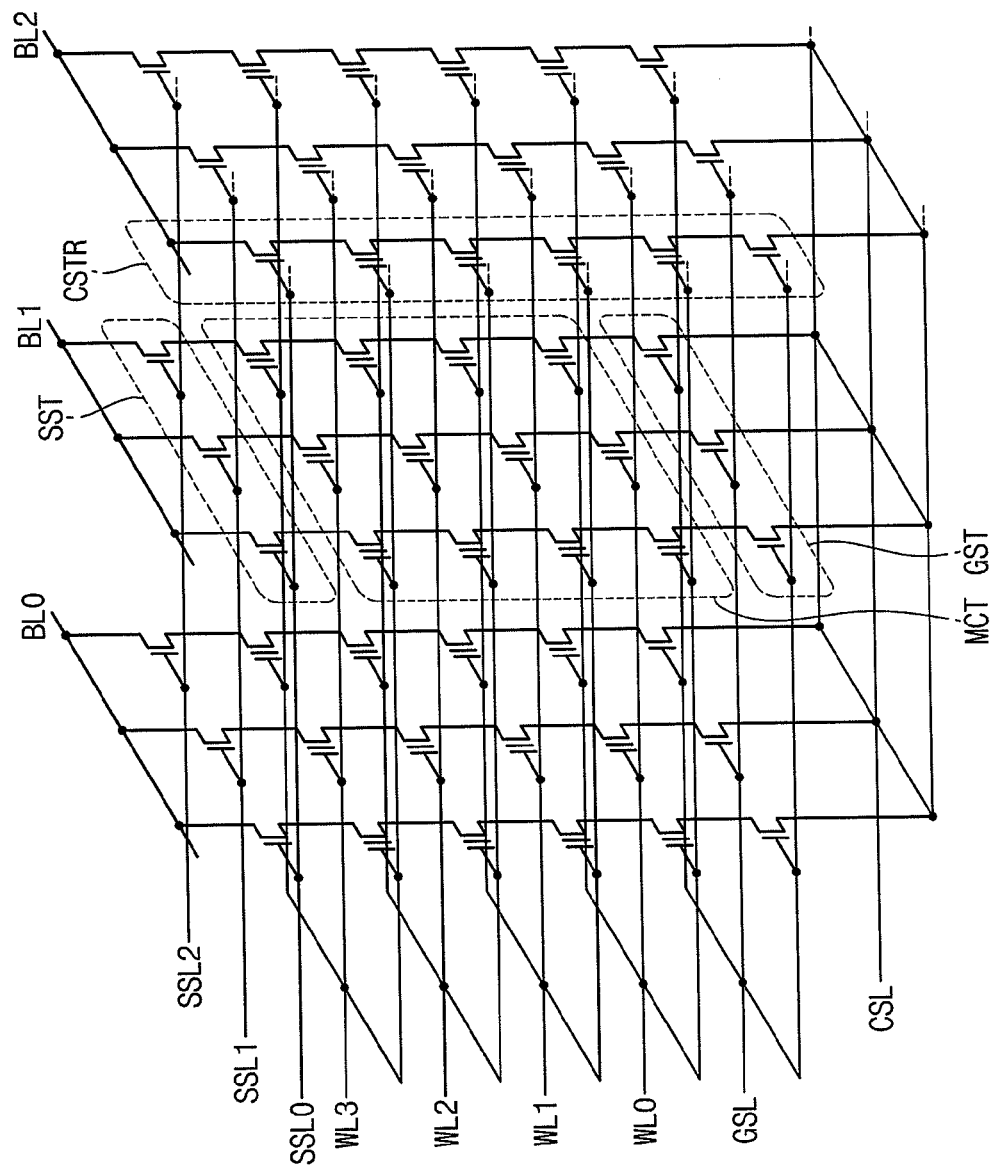
FIG. 1 illustrates a schematic diagram of a nonvolatile memory device according to an embodiment.

Korean Patent Application No. 10-2009-0093292, filed on Sep. 30, 2009, in the Korean Intellectual Property Office, and entitled: "Nonvolatile Memory Device and Method for Fabricating the Same," is incorporated by reference herein in its e Exemplary embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

In the drawings, the dimensions of layers and regions may be exaggerated for clarity of illustration. It will be understood that when an element such as a layer, film, region, or substrate is referred to as being "on" another element, it can be directly on the other element or intervening elements may also be present. Further, it will be understood that when an element is referred to as being 'under' another element, it can be directly under, and one or more intervening elements may also be present. In addition, it will also be understood that when an element is referred to as being 'between' two elements, it can be the only element between the two elements, or one or more intervening elements may also be present. Like reference numerals refer to like elements throughout the specification.

In the following description, the technical terms are used only for explain a specific exemplary embodiment while not limiting the inventive concept. The terms of a singular form may include plural forms unless referred to the contrary. The meaning of "include," "comprise," "including," or "comprising," specifies a property, a region, a fixed number, a step, a process, an element and/or a component, but does not exclude other properties, regions, fixed numbers, steps, processes, elements and/or components. Additionally, in the following description, some elements may be illustrated in plural while some elements may be illustrated in singular, however, unless specified otherwise, embodiments may include not only more or less of the elements, but also a plurality of elements illustrated in singular or only one of the elements illustrated in plural.

Additionally, the embodiment in the detailed description will be described with reference to sectional views and/or plan views as ideal exemplary view of the inventive concept. Shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. For example, an etching region illustrated as angular may have a round shape or a certain curvature. Therefore, regions exemplified in the drawings have general properties, and are used to illustrate a specific shape of a device region. Thus, this should not be construed as limiting the scope of the inventive concept.

Hereinafter, exemplary embodiments of the inventive concept will be described in detail with reference to the accompanying drawings. A semiconductor memory device according to embodiments may have a three-dimensional structure.

Figure 2:
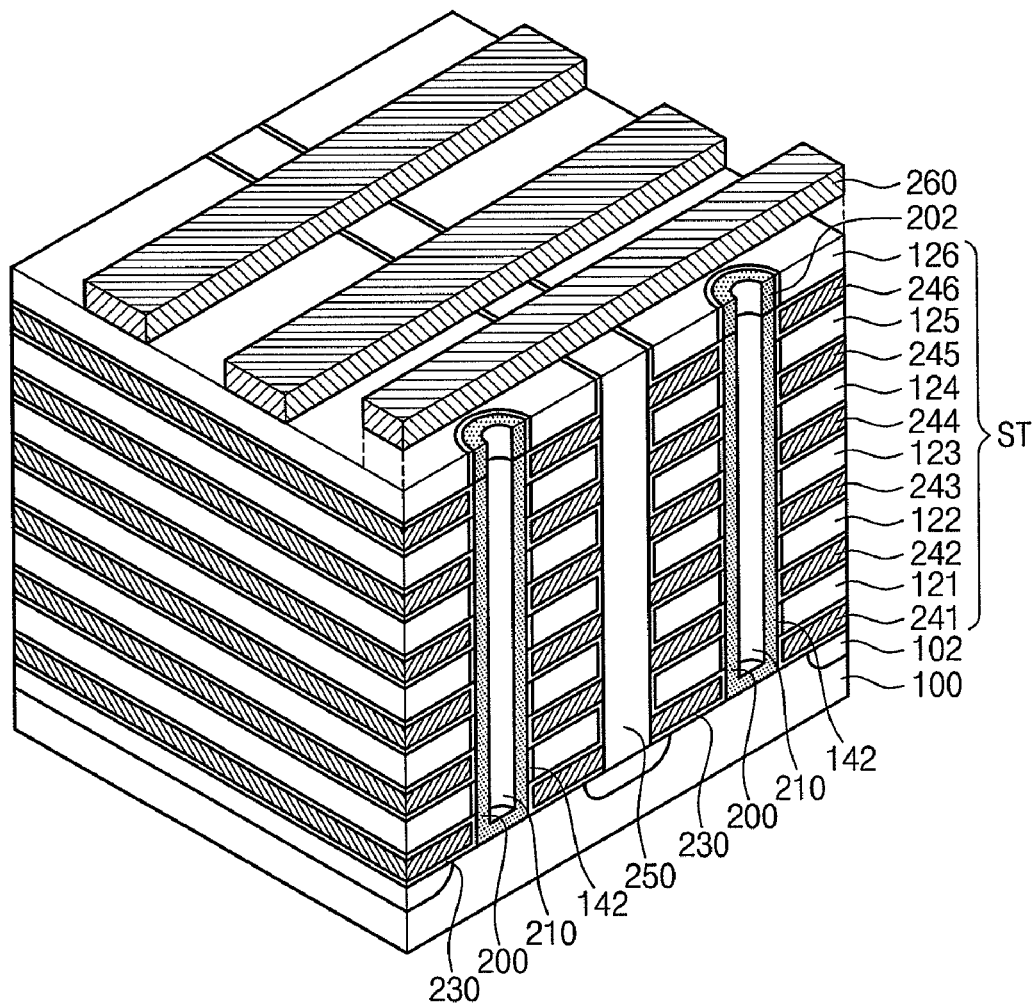
FIG. 2 illustrates a structural diagram of a portion of the nonvolatile memory device of FIG. 1 according to an embodiment.
Figure 3:
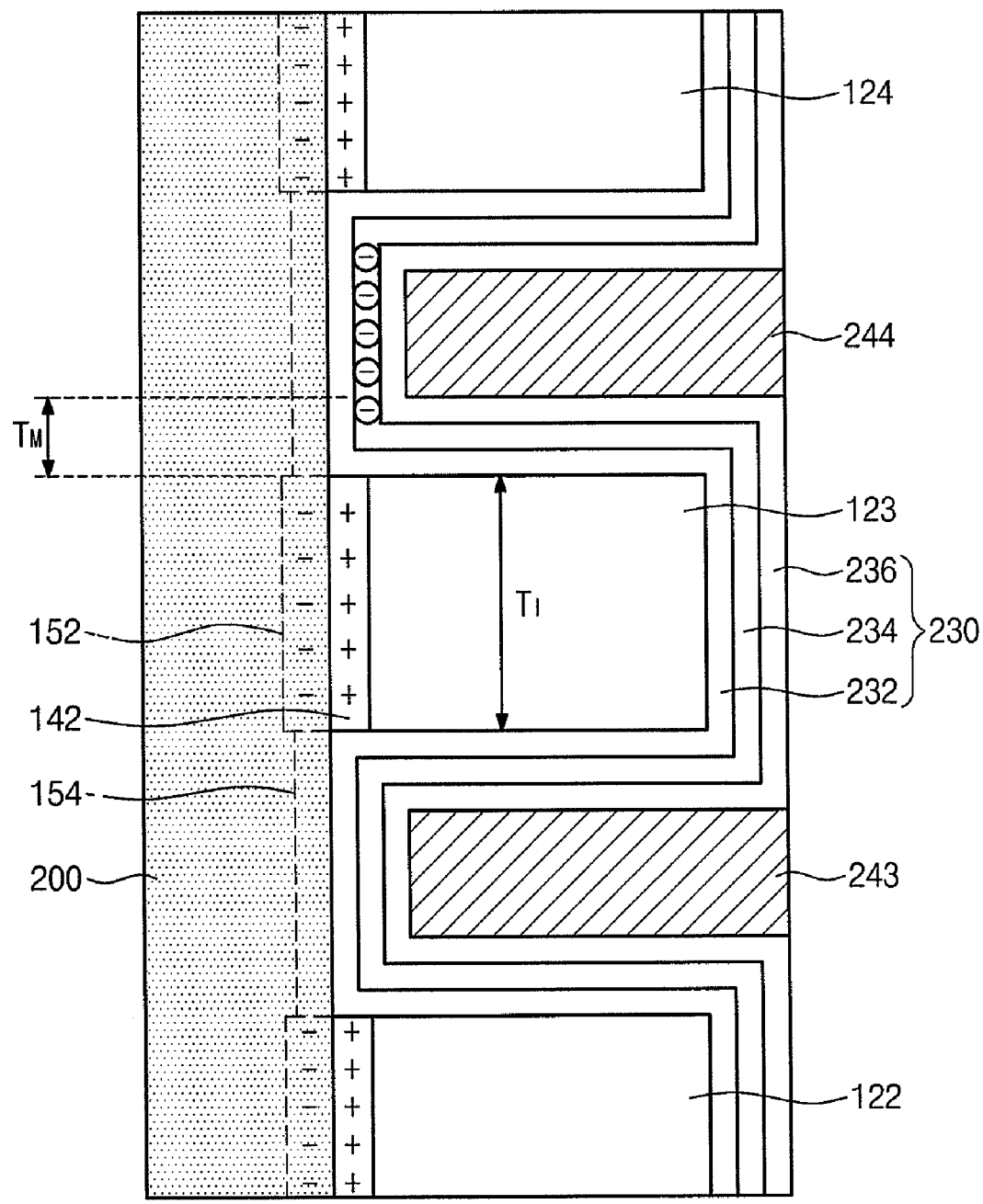
FIG. 3 illustrates a cross-sectional diagram of a portion of the memory cells of the nonvolatile memory device of FIG. 1.

FIG. 1 illustrates a schematic diagram of a nonvolatile memory device according to an embodiment. FIG. 2 illustrates a structural diagram of a portion of the nonvolatile memory device of FIG. 1. FIG. 3 illustrates a cross-sectional diagram of a portion of the memory cells of the nonvolatile memory device of FIG. 1.

Referring to FIGS. 1 and 2, a three-dimensional semiconductor memory device according to an embodiment may include a common source line CSL, a plurality of bit lines BL0, BL1 and BL2, and a plurality of cell strings CSTR disposed between the common source line CSL and the bit lines BL0 to BL2.

The common source line CSL may be a conductive thin film on a semiconductor substrate 100 or an impurity region in the semiconductor substrate 100. The bit lines BL0 to BL2 may be conductive patterns, e.g., metal lines, disposed over the semiconductor substrate 100. The bit lines BL0 to BL2 may be two-dimensionally arranged. The plurality of cell strings CSTR may be connected to the respective bit lines BL0 to BL2 in parallel. Thus, the cell strings CSTR may be two-dimensionally arranged over the common source line CSL and/or the semiconductor substrate 100.

The respective cell strings CSTR may include a ground select transistor GST connected to the common source line CSL, a string select transistor SST connected to the bit lines BL0 to BL2, and a plurality of memory cell transistors MCT disposed between the ground and string select transistors GST and SST. The ground select transistor GST, and the string select transistor SST, and the memory cell transistors MCT of each of the cell strings CSTR may be connected to each other in series. In addition, a ground select line GSL, a plurality of word lines WL0 to WL3, and a plurality of string select lines SSL, which may be disposed between the common source line CSL and the bit lines BL0 to BL2, may be used as gate electrodes of the ground select transistor GST, the memory cell transistors MCT, and the string select transistors SST, respectively.

All of the string select lines SSL may be arranged at a same distance from the semiconductor substrate 100. In embodiments in which the cell strings CSTR include a plurality of memory cell transistors MCT, each of the memory cell transistors of the respective cell string CSTR may be arranged at a different distance from the semiconductor substrate 100. Respective ones of the memory cell transistors MCT of each of the cell strings CSTR may be arranged in respective rows such that memory cell transistors MCT of each of the rows may be arranged a same distance from the semiconductor substrate 100. Further, respective ones of the memory cell transistors MCT of different ones of the cell strings CSTR that are arranged along a same row may be commonly connected to a respective one of the word lines WL0 to WL3.

All of the ground select transistors GST may be disposed a same distance from the semiconductor substrate 100. The gate electrodes of the ground select transistors GST may be commonly connected to the ground select line GSL to be in an equipotential state. Similarly, the gate electrodes of the plurality of memory cell transistors MCT disposed at substantially a same distance, e.g., within same row, from the common source line CSL may also be commonly connected to the respective word line WL0 to WL3 to be in an equipotential state. In embodiments in which one cell string CSTR includes a plurality of the memory cell transistors MCT, which may be arranged at different distances from the common source line CSL, multi-layered word lines WL0 to WL3 may be disposed between the common source line CSL and the bit lines BL0 to BL2.

The cell strings CSTR may include a semiconductor pattern 200 vertically extended from the semiconductor substrate 100 to be connected to the bit lines BL0 to BL2. The semiconductor pattern 200 may be formed to penetrate through the ground select line GSL and the word lines WL0 to WL3.

A data storage layer 230 may be disposed between the word lines WL0 to WL3 and the semiconductor pattern 200. According to an embodiment, the data storage layer 230 may be a charge storage layer. For example, the data storage layer 230 may be an insulating layer including a trap insulating layer, a floating gate electrode, and/or conductive nano dots.

Referring to FIG. 2, a stack structure ST in which conductive patterns 241 to 246 and interlayer dielectric patterns 121 to 126 are alternately stacked may be disposed on the semiconductor substrate 100.

The semiconductor substrate 100 may be a semiconductor layer of a single crystal structure, and may include an impurity region 102 as a common source line. In this case, the semiconductor substrate 100 and the impurity region 102 used as a common source line may be of different conductive types.

The stack structure ST may include a plurality of conductive patterns 241 to 246 and a plurality of interlayer dielectric patterns 121 to 126 that may be vertically stacked. The interlayer dielectric patterns 121 to 126 may be alternatively stacked between the conductive patterns 241 to 246. The conductive patterns 241 to 246 of the stack structure ST may correspond to the ground select line GSL, word lines WL0 to WL3, and the string select lines SSL and, e.g., may be stacked according to stacking sequence illustrated in FIG. 1.

The conductive patterns 241 to 246 may include conductive material, e.g., doped semiconductor, metals, metal nitrides, and/or metal silicides. The conductive patterns 241 to 246 may be formed in a direction crossing a bit line 260. The conductive patterns 241 to 246 may control electrical connections between the bit line 260 and the common source line (CSL of FIG. 1) by controlling a potential of the semiconductor pattern 200. More specifically, the semiconductor pattern 200 may be capacitively coupled to the conductive patterns 241 to 246 and may form a MOS capacitor. In this case, a voltage applied to the conductive patterns 241 to 246 may variably control the potential of the semiconductor pattern 200 adjacent to the conductive patterns 241 to 246. The energy band of the semiconductor pattern 200 may be inversed according to the voltage applied to the conductive patterns 241 to 246. Accordingly, electrical connection between the bit line 260 and the common source line, e.g., impurity region 102, may be controlled by the voltage applied to the conductive patterns 241 to 246.

The semiconductor pattern 200 may be connected to the semiconductor substrate 100 through the stack structure ST. The data storage layer 230 may be disposed between the semiconductor pattern 200 and the conductive patterns 241 to 246. A buried insulating layer 250 may be disposed between the stack structures ST adjacent to each other horizontally. Thus, the conductive patterns 241 to 246 horizontally adjacent to each other may be electrically insulated. The bit line 260 may be disposed on the plurality of semiconductor patterns 200 and may be arranged to extend along a direction crossing a direction along which the conductive patterns 241 to 246 extend.

A dielectric layer may be disposed between the ground select line GST, e.g., respective ones of the conductive patterns, e.g., 241, and the semiconductor pattern 200 and/or between the string selection lines SSL, e.g., respective ones of the conductive patterns, e.g., 246, and the semiconductor pattern 200. The dielectric layer may correspond to a portion, e.g., one or more layers, of the data storage layer 230. That is, e.g., the data storage layer 230 may include, e.g., a plurality of layers, and, e.g., one or more of such layers may be disposed between the ground select line GST and the semiconductor pattern 200 and/or between the string select lines SST and the semiconductor pattern 200 and may function as a gate insulating layer for a typical MOSFET and may include, e.g., silicon oxide. More particularly, e.g., the dielectric layer may be disposed between the ground select line GSL and the semiconductor pattern 200 and/or between the string select lines SSL and the semiconductor pattern 200 and may be used as a gate insulating layer of the ground select transistor GST or the string select transistors SST, respectively. The gate insulating layer of the ground select transistor GST and/or the string select transistors SST may include a same material as at least a portion of the data storage layer 230 of the memory cell transistor MCT.

The ground and string select transistors GST and SST, and the memory cell transistors MCT may be a MOSFET using the semiconductor pattern 200 as a channel region.

The semiconductor pattern 200 may include a single crystal semiconductor and/or a polycrystalline semiconductor. The semiconductor pattern 200 may be an intrinsic semiconductor. The semiconductor pattern 200 may extend vertically from to the semiconductor substrate 100. The semiconductor pattern 200 may have a circular or polygonal pillar shape. More particularly, the semiconductor pattern 200 may have a hollow cylindrical or a cup-like shape.

The semiconductor pattern 200 may be formed to be of the same conductive type as the semiconductor substrate 100 contacting the semiconductor pattern 200. Thus, the semiconductor pattern 200 and the semiconductor substrate 100 may be electrically connected to each other. An insulating layer 210 may be buried in the semiconductor pattern 200. Also, a thickness of the semiconductor pattern 200 may be smaller than a width of a depletion region generated therein, or may be smaller than an average length of silicon grains forming polycrystalline silicon.

The semiconductor pattern 200 may include an impurity region 202 having a different conductive type from the semiconductor pattern 200. The impurity region 202 may be in a region of the semiconductor connected to the bit line 260.

The data storage layer 230 may extend on top surfaces and bottom surfaces of the respective conductive patterns 241 to 246 between the semiconductor pattern 200 and the conductive patterns 241 to 246. Specifically, the data storage layer 230 may be disposed between the top surfaces of the respective conductive patterns 241 to 246 and the bottom surfaces of the interlayer dielectric patterns 121 to 126, and may be disposed between the bottom surfaces of the respective conductive patterns 241 to 246 and the top surfaces of the interlayer dielectric patterns 121 to 126.

The data storage layer 230 may include a charge storage layer. The data stored in the data storage layer 230 may be changed using Fowler-Nordheim tunneling caused by a voltage difference between the semiconductor pattern 200 and the conductive patterns 241 to 246. In some embodiments, the data storage layer 230 may be a thin film, e.g., thin film for a phase-change memory or a variable resistance memory, capable of storing information using a different operating principle.

Referring to FIG. 3, the data storage layer 230 may include a charge tunneling layer 232 adjacent to the semiconductor pattern 200, a charge blocking layer 236 adjacent to the conductive patterns 243 and 244, and a charge storage layer 234 between the charge tunneling layer 232 and the charge blocking layer 236. The charge tunneling layer 232 may include a material having a dielectric constant smaller than that of the charge blocking layer 236. The charge storage layer 234 may be an insulating thin film, e.g., silicon nitride, abundant in charge trap sites, or may be an insulating thin film including conductive particles. The charge blocking layer 236 may include silicon oxide, silicon nitride, silicon oxynitride, and/or a high dielectric layer, or may be a multi-layer thin film including a high dielectric layer. For example, the charge tunneling layer 232 may include silicon oxide. The charge storage layer 234 may include silicon nitride. The charge blocking layer 236 may include aluminum oxide.

Referring back to FIG. 2, a fixed charge layer 142 may be disposed between the semiconductor pattern 200 and the interlayer dielectric patterns 121 to 126.

The fixed charge layer 142 may directly contact a surface of the semiconductor pattern 200, and may include positive or negative fixed charges. The fixed charge layer 142 may include a material including elements that generate the positive or negative fixed charges. The elements may be segregated into the semiconductor pattern 200 by heat. The electrical polarity of the fixed charges may be identical to that of majority carriers of the semiconductor pattern 200. The electrical polarity of the fixed charges may vary with materials forming the fixed charge layer 142. The material forming the fixed charge layer 142 may be a material having a dielectric constant smaller than that of the interlayer dielectric patterns 121 to 126. Also, the fixed charge layer 142 may have a thickness range from about several A to about several tens of nm. For example, the fixed charge layer 142 may have a thickness equal to or smaller than that of the data storage layer 230.

Specifically, when the semiconductor pattern 200 includes a p-type semiconductor material, the fixed charge layer 142 may include a material including elements that generate positive fixed charges. For example, elements generating positive fixed charges may include nitrogen (N), hydrogen (H), hafnium (Hf), and/or zirconium (Zr), and the fixed charge layer 142 having the positive fixed charges may include silicon nitride (SiN), silicon oxynitride (SiON), hafnium oxide, and/or zirconium oxide.

On the other hand, when the semiconductor pattern 200 includes an n-type semiconductor material, the fixed charge layer 142 may include a material including elements that generate negative fixed charges. For example, the elements generating negative fixed charges may include fluorine (F), phosphorus (P), and/or aluminum (Al), and the fixed charge layer 142 having the negative fixed charges may include aluminum oxide and/or aluminum oxynitride.

Referring again to FIG. 3, a nonvolatile memory device may include the semiconductor pattern 200 extending vertically relative to a semiconductor substrate 100, conductive patterns 243 and 244 disposed on a sidewall of the semiconductor pattern 200, and the fixed charge layer 142 disposed between the conductive patterns 243 and 244. The data storage layer 230 may be disposed between sidewalls of the conductive patterns 243 and 244 and the semiconductor pattern 200. The interlayer dielectric patterns 122, 123, 124 may be disposed between the conductive patterns 243 and 244.

The semiconductor pattern 200 may include a channel region 154 adjacent to the conductive patterns 243 and 244 and a channel connection region 152 adjacent to the fixed charge layer 142. The fixed charge layer 142, as described above, may include positive or negative fixed charges according to the conductive type of the semiconductor pattern 200. An energy level of the channel connection region 152 may be determined by fixed charge included in the fixed charge layer 142. Specifically, since the fixed charges included in the fixed charge layer 142 may generate an electrostatic field, the channel connection region 152 adjacent to the fixed charge layer 142 may have an energy level based on the charge density or charge quantity of the fixed charges included in the fixed charge layer 142. For example, the energy level of the channel connection region 152 may be a depletion state or an inversion state according to the charge density or the charge quantity of the fixed charges included in the fixed charge layer 142.

Similarly, referring to FIG. 3, an energy level of the channel region 154 may be variably determined by a voltage applied to the adjacent conductive pattern, e.g., 243, 244. When a voltage greater than a threshold voltage of a memory cell transistor is applied to the conductive patterns 243, 244, the channel region 154 may enter the inversion state to turn on the corresponding memory cell transistor. Unlike this, when a voltage smaller than the threshold voltage is applied to the conductive patterns 243, 244, the channel region 154 may enter the depletion state or accumulation state to turn off the corresponding memory cell transistor.

According to an embodiment, the energy level of the channel region 154 may be variably determined by the voltage applied to the respective conductive pattern 243, 244. However, when a number of the fixed charges included in the fixed charge layer 142 is pinned, the energy level of the channel connection region 152 may be pinned.

As described above, the data storage layer 230 may horizontally extend from the sidewall of the conductive patterns 243 and 244 and may cover the top surfaces and the bottom surfaces of the conductive patterns 243 and 244. Such a horizontal extension of the charge storage layer 234 may increase a distance between the vertically stacked conductive patterns 243 and 244. For example, referring to FIG. 3, a distance between the vertically stacked conductive patterns 243 and 244 may be TI+2TM, where TI is a thickness of the interlayer dielectric pattern, and TM is a thickness of the data storage layer 230.

In some embodiments, the nonvolatile memory device may be configured such that an electrical path between the bit line BL and the common source line CSL, described above with reference to FIG. 1, passes through the semiconductor pattern 200. For such an electrical path, the channel regions 154 and the channel connection regions 152 in the semiconductor pattern 200 may be connected to each other in series.

However, when the fixed charge layer 142 is absent, the electrical path may be difficult to complete due to the horizontal extension of the charge storage layer 234 and an increase in an interval between the conductive patterns 243 and 244. Specifically, due to a fringe field from the conductive patterns 243 and 244, the channel region 154 may be vertically extended from the side surface of the corresponding conductive patterns 243 and 244 to have a length greater than a thickness of the corresponding conductive patterns 243 and 244. However, the length of such an extension depends on a voltage applied to the conductive patterns 243 and 244. Accordingly, if the fixed charge layer 142 is absent, and a voltage applied to the channel region 154 is small, then the channel region 154 adjacent to one conductive pattern may not be connected in series to the channel region 154 adjacent to another conductive pattern, or an overlapping area therebetween may be reduced. In this case, the electrical path between the bit line and the common source line may not be completed, or may have low on-current characteristics. These technical limitations may be overcome by employing the fixed charge layer 142.

More particularly, e.g., when the quantity of the fixed charges included in the fixed charge layer 142 is sufficient to make the channel connection region 152 be in the inversion state, the channel region 154 adjacent to one of the conductive patterns 243 and 244 may be connected to the channel connection region 152, thereby completing the electrical path. Even though the channel connection region 152 is in the depletion state, the completion of the electrical path may be more easily achieved when the fixed charge layer 142 is present than when the fixed charge layer 142 is absent.

Also, the fixed charge layer 142 may include fixed charges having electrical polarity that may contribute to completion of the electrical path or inversion of the channel connection region 152. For example, the electrical polarity of the fixed charges may be identical to the electrical polarity of majority carriers of the semiconductor pattern 200.

Specifically, when positive fixed charges are generated in the fixed charge layer 142, electrons may accumulate in the channel connection region 152. On the other hand, when negative fixed charges are generated in the fixed charge layer 142, holes may accumulate in the channel connection region 152. Such a channel connection region 152 may be used as source/drain region of the memory cell transistor MCT. Also, vertically adjacent memory cells may share the channel connection region 152 induced by the fixed charge layer 142.

The resistance of the channel connection region 152 may be inversely proportional to a density of the fixed charges in the fixed charge layer 142, and may be varied by controlling a quantity of the elements generating the fixed charges. As the resistance of the channel connection region 152 decreases, a cell current between the bit line BL and the common source line CSL may increase progressively during operation of the nonvolatile memory device.

Due to the fixed charges in the fixed charge layer 142, the number of majority carriers in the channel connection region 152 may be smaller than that of the channel region 154 in a non-inversed state. Accordingly, when a certain voltage is applied to the conductive patterns 243 and 244 to invert the channel regions 154, electrical connection characteristics between adjacent channel regions 154 may be improved.

Figure 4:
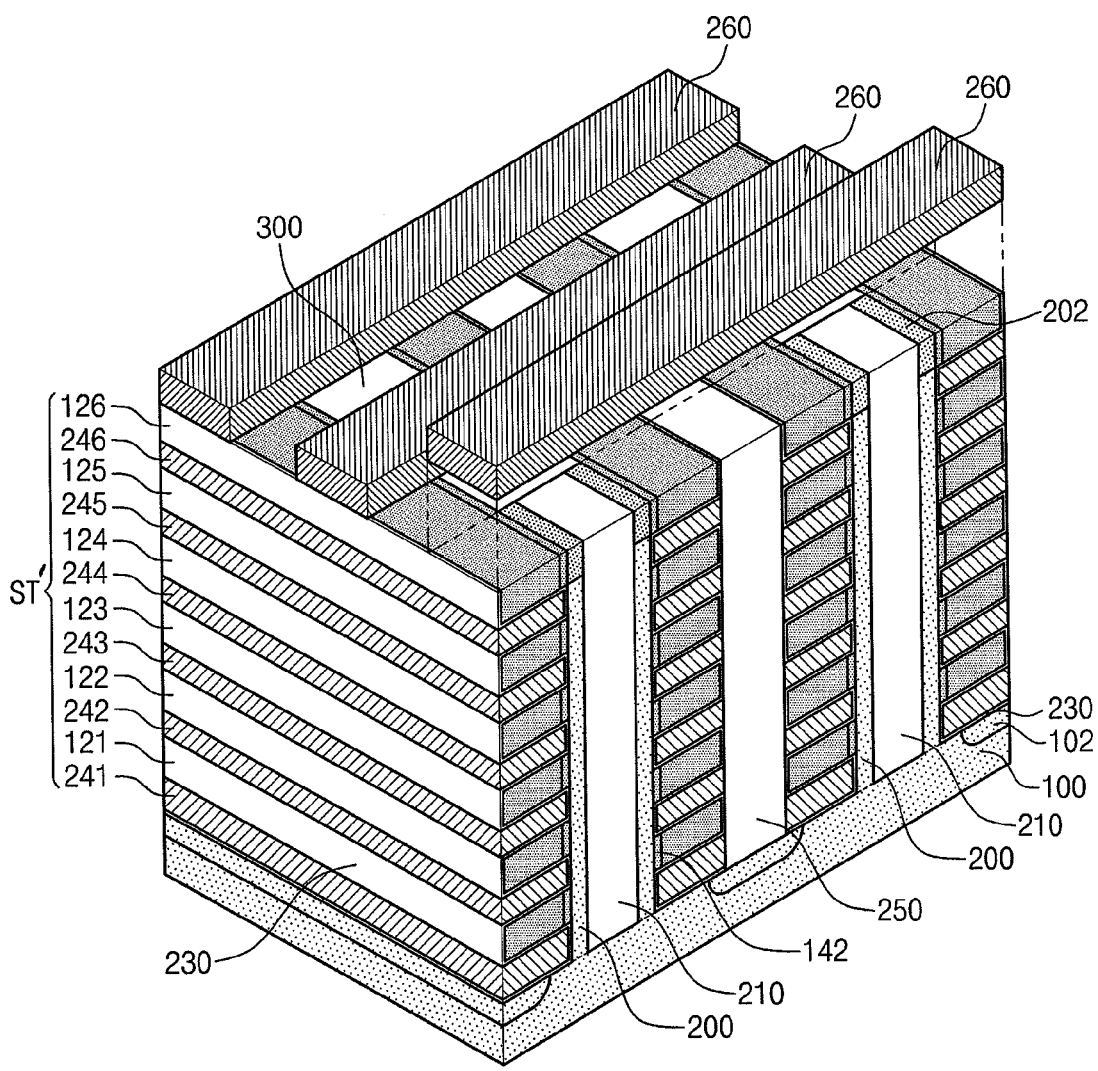
FIG. 4 illustrates a structural diagram of a portion of the nonvolatile memory device of FIG. 1 according to another embodiment.

FIG. 4 illustrates a structural diagram of a portion of the nonvolatile memory device of FIG. 1 according to another embodiment. The exemplary nonvolatile memory device illustrated in FIG. 4 substantially corresponds to the exemplary nonvolatile memory device illustrated in FIGS. 2 and 3, and thus, only differences between the exemplary embodiment of FIGS. 2 and 3, and the exemplary embodiment of FIG. 4 will be described below.

Referring to FIG. 4, a stack structure ST' may have a linear shape over a semiconductor substrate 100. A plurality of the semiconductor patterns 200 may be disposed on a sidewall of one stack structure ST'. The semiconductor patterns 200 may have a vertical linear shape with respect to the semiconductor substrate 100, and may be disposed to be spaced from a sidewall of the stack structure ST' by a certain interval. A buried insulating layer 300 may be disposed between the semiconductor patterns 200 crossing the sidewall of one stack structure ST'. Also, the semiconductor patterns 200 on adjacent ones of the stack structures ST' may be disposed to face each other. A space between the semiconductor patterns 200 may be filled with an insulating layer 210. That is, the buried insulating layer 300 and the insulating layer 210 may be formed between adjacent ones of the semiconductor patterns 200.

FIGS. 5, 6, 7, 8, 9, 10, 11, and 12 illustrate cross-sectional diagrams of resulting structures of stages of a method for fabricating a nonvolatile memory device according to an embodiment. Hereinafter, a method for fabricating a nonvolatile memory device according to embodiment will be described in detain with reference to FIGS. 5 through 12.

Figure 5:
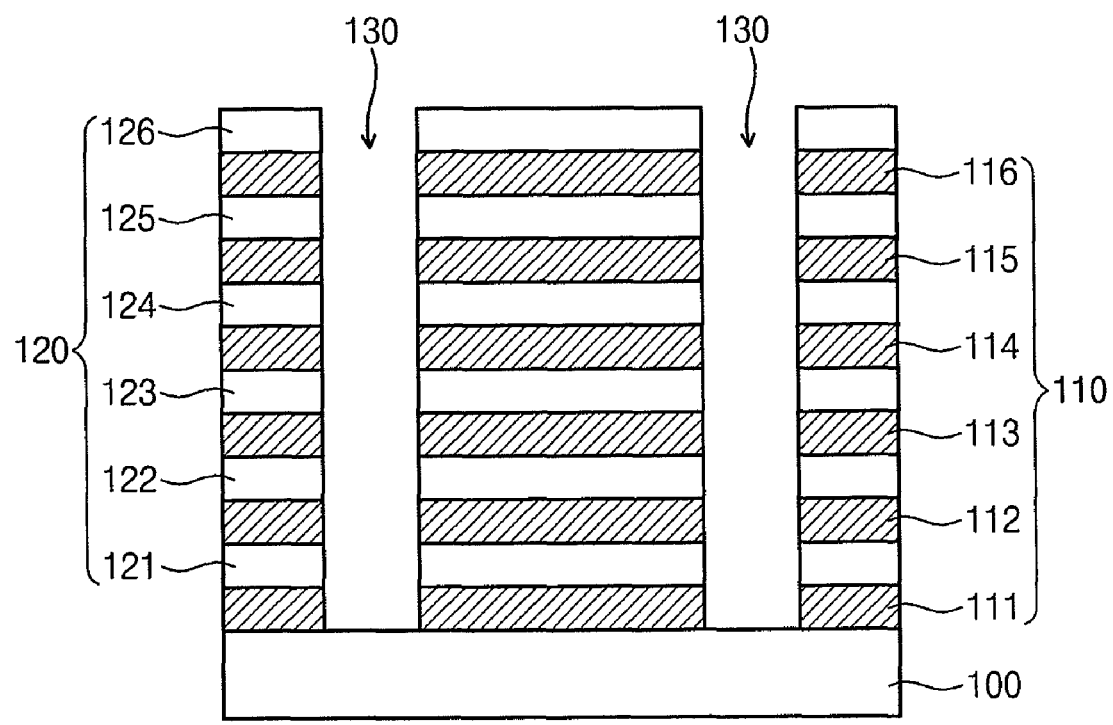
FIGS. 5, 6, 7, 8, 9, 10, 11, and 12 illustrate cross-sectional diagrams of resulting structures of stages of a method for fabricating a nonvolatile memory device according to an embodiment.

Referring to FIG. 5, a plurality of thin film structures, e.g., first thin film structure 110 and second thin film structure 120 may be alternatively stacked on the semiconductor substrate 100. More particularly, the first thin film structure may include a plurality of first material layers 111 to 116, and the second thin film structure may include a plurality of second material layers 121 to 126, and the first material layers 111 to 116 and the second material layers 121 to 126 may be alternately stacked on the semiconductor substrate 100. Referring to FIG. 5, e.g., the first thin film structure 110 may include the plurality of first material layers 111 to 116 that are spaced from each other and the second thin film structure 120 may include the plurality of second material layers 121 to 126 interposed between the first material layers 111 to 116 of the first thin film structure 110. That is, the first material layers 111 to 116 of the first thin film structure 110 and the second material layers 121 to 126 of the second thin film structure 120 may be alternatively arranged in a stack.

The number of the first and second materials 111 to 116 and 121 to 126 forming the thin film structures 110 and 120 may be varied based on the memory capacity.

The first and second thin film structures 110 and 120 may be formed of thin films having different characteristics, e.g., different etch rates in an isotropic etching process and/or different etch rates in an anisotropic etching process. For example, the first material layers 111 to 116 may be formed of materials that may be selectively removed while minimizing etching of the second material layers 121 to 126. For example, the first and second material layers 111 to 116 and 121 to 126 may include silicon oxide undoped with impurities, silicon oxide doped with impurities, silicon nitride, silicon oxynitride, and/or a dielectric layer having a low dielectric constant, e.g., SiOC and SiOF.

Also, a material layer to be removed during a subsequent process may be first formed such that a lower select line to be formed during a subsequent process may effectively control potentials of the semiconductor pattern 200 and the semiconductor substrate 100.

Thereafter, first openings 130 may be formed in the thin film structures 110 and 120 to expose an upper surface of the semiconductor substrate 100. The first openings 130 may have a hole or trench shape. Specifically, forming of the first openings 130 may include forming a mask pattern (not shown) defining planar positions of the openings 130 on the thin film structure 110 and 120 and anisotropically etching the thin film structures 110 and 120 using the mask pattern as an etch mask. As the first openings 130 are formed, sidewalls of the first and second thin film structures 110 and 120 may be exposed.

Figure 6:
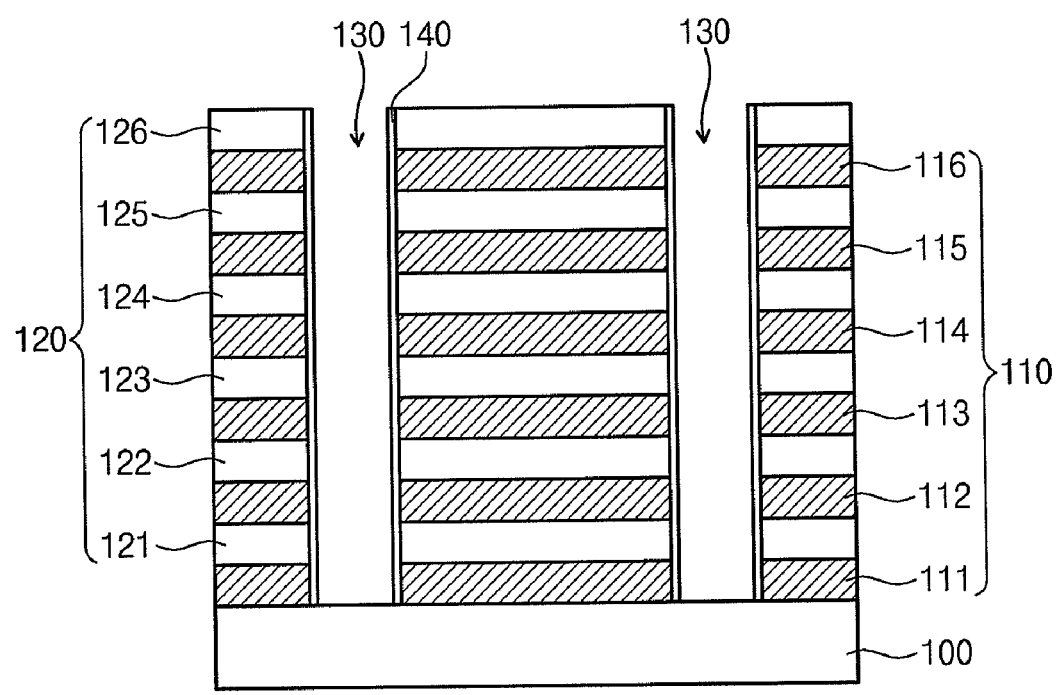

Referring to FIG. 6, the fixed charge layer 140 may be formed on a surface of the first and second material layers 111 to 116 and 121 to 126 exposed to the first openings 130.

The fixed charge layer 140 may be formed of a material including elements generating positive or negative fixed charges according to the conductive type of the semiconductor pattern 200. The fixed charge layer 140 may have a very small thickness of, e.g., about several nm to about several tens of nm.

Specifically, when the semiconductor pattern 200 is a p-type, the fixed charge layer 140 may be formed of a material including elements generating positive fixed charges. For example, elements generating the positive fixed charges may include nitrogen (N), hydrogen (H), hafnium (Hf), and/or zirconium (Zr).

On the other hand, when the semiconductor pattern 200 is an n-type, the fixed charge layer 140 may be formed of a material including elements generating negative fixed charges. For example, elements generating the negative fixed charges may include fluorine (F), phosphorous (P), and/or aluminum (Al).

The fixed charge layer 140 may be formed by a plasma process or an annealing process using a process gas including elements generating fixed charges. For example, the fixed charge layer 140 having the positive fixed charges may be formed by the plasma process or the annealing process using a process gas including, e.g., $N_2$, $N_2O$, NO, $NH_3$, and/or $H_2$. Also, the density of the fixed charges of the fixed charge layer 140 may be controlled by adjusting the duration of the plasma process and the annealing process. As the density of the fixed charges increases, the resistance of the channel connection region 152 induced by the fixed charge layer 140 may be reduced. That is, the resistance of the channel connection region 152 provided to the source/drain region of transistors may be reduced, thereby increasing an on-state cell current.

Also, as another method for forming the fixed charge layer 140, the fixed charge layer 140 may be formed by depositing an insulating layer having elements generating fixed charges. For example, the fixed charge layer 140 including positive fixed charges may be formed by depositing silicon nitride (SiN), silicon oxynitride (SiON), hafnium oxide, and/or zirconium oxide. The fixed charge layer 140 including negative fixed charges may be formed by depositing aluminum oxide and/or aluminum oxynitride.

As another method for forming the fixed charge layer 140, the fixed charge layer 140 may be formed by ion-implanting elements generating the fixed charges into the surface of the first and second material layers 111 to 116 and 121 to 126.

Figure 7:
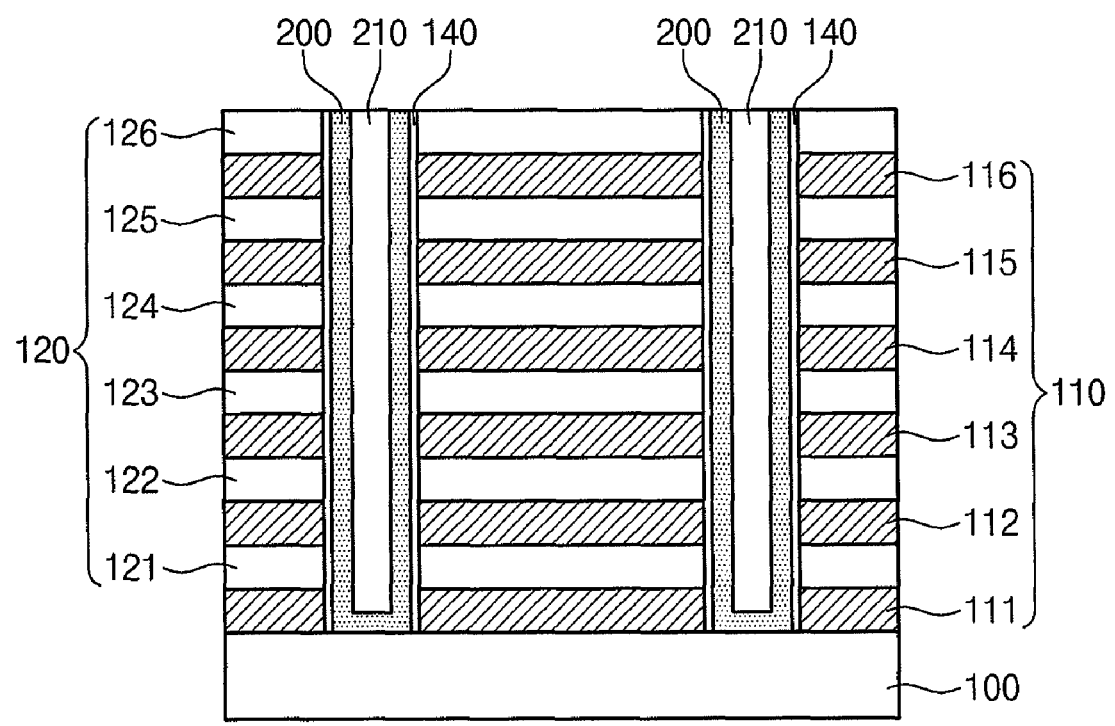

Referring to FIG. 7, the semiconductor pattern 200 may be formed to be extended from the semiconductor substrate 100 and contact the fixed charge layer 140. The semiconductor pattern 200 may be formed of the same material as the semiconductor substrate 100.

The semiconductor pattern 200 may be conformally formed along an inner wall of the first opening 130. That is, the semiconductor pattern 200 may be formed to have, e.g., a hollow cylindrical shape or a well shape. An inner space of the semiconductor pattern 200 may be filled with the insulating layer 210. In embodiments, the thickness of the semiconductor pattern 200 may be smaller than the width of a depletion region generated therein, and/or may be smaller than an average length of silicon grains forming polycrystalline silicon.

The semiconductor pattern 200 may have a circular or polygonal pillar shape that fills the first openings 130. When the first openings 130 have a trench shape, the plane of the semiconductor pattern 200 may be linear.

The semiconductor pattern 200 may include, e.g., polycrystalline or amorphous silicon. A discontinuous boundary surface of a crystal structure may be formed between the semiconductor substrate 100 and the semiconductor pattern 200. The semiconductor substrate 100 and the semiconductor pattern 200 may be silicon of a single crystal structure smoothly connected without a crystal defect.

The semiconductor pattern 200 may be formed using Chemical Vapor Deposition (CVD) or Atomic Layer Deposition (ALD). The semiconductor pattern 200 may also be formed by a Selective Epitaxial Growth (SEG) process using the semiconductor substrate 100 exposed by the first opening 130 as a seed layer. The semiconductor pattern 200 may also be formed by a Laser-induce Epitaxial Growth (LEG) process that grows an amorphous semiconductor layer in the first openings 130, and then irradiates a laser beam such as an excimer laser on the amorphous semiconductor layer to crystallize the semiconductor layer.

Figure 8:
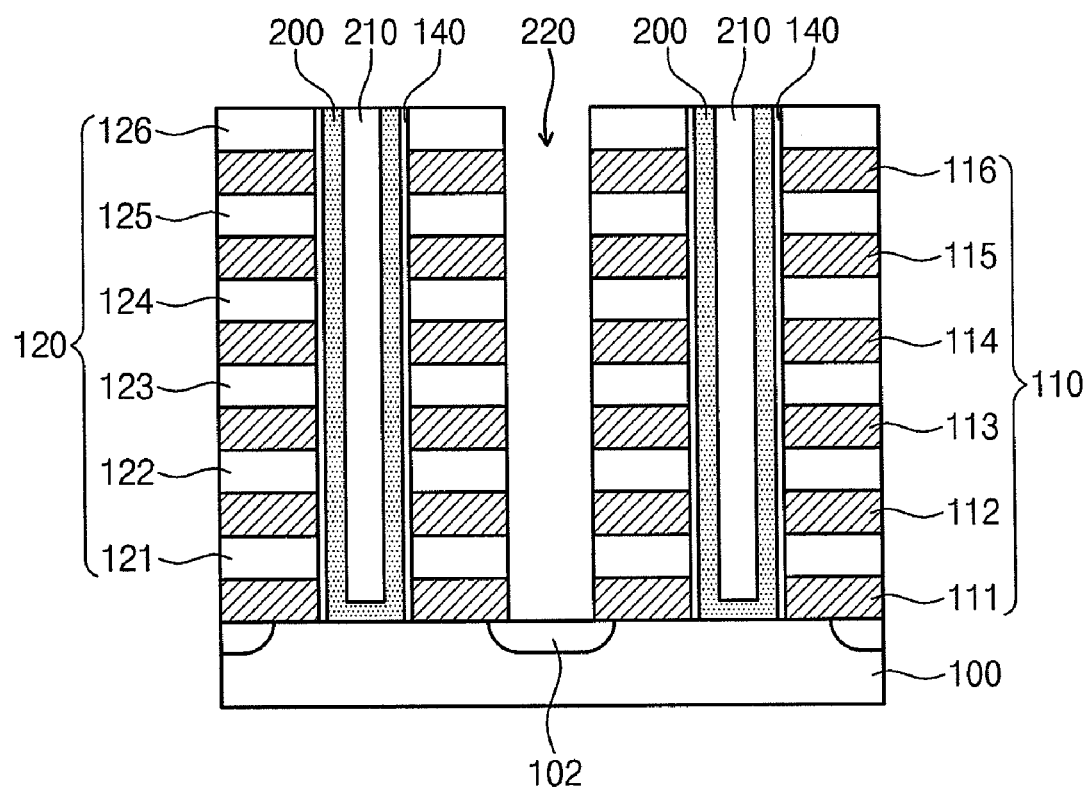

Referring to FIG. 8, second openings 220 may be formed in the thin film structures 110 and 120 to expose the upper surface of the semiconductor substrate 100. The second openings 220 may be formed by performing a typical photolithography and etching processes on the first and second thin film structures 110 and 120. The second openings 220 may be formed in a linear shape between the first openings 130 in which the semiconductor patterns 200 have been formed. The second openings 220 may expose the surface of the semiconductor substrate 100 in a linear shape. As the second openings 220 are formed, sidewalls of the first and second material layers 111 to 116 and 121 to 126 of the thin film structures 110 and 120 may be exposed to the second opening 220.

The impurity region 102 may then be formed in the semiconductor substrate 100 exposed by the second opening 220. In some embodiments, the impurity region 102 may be formed before the thin film structures 110 and 120 are formed on the semiconductor substrate 100.

Figure 9:
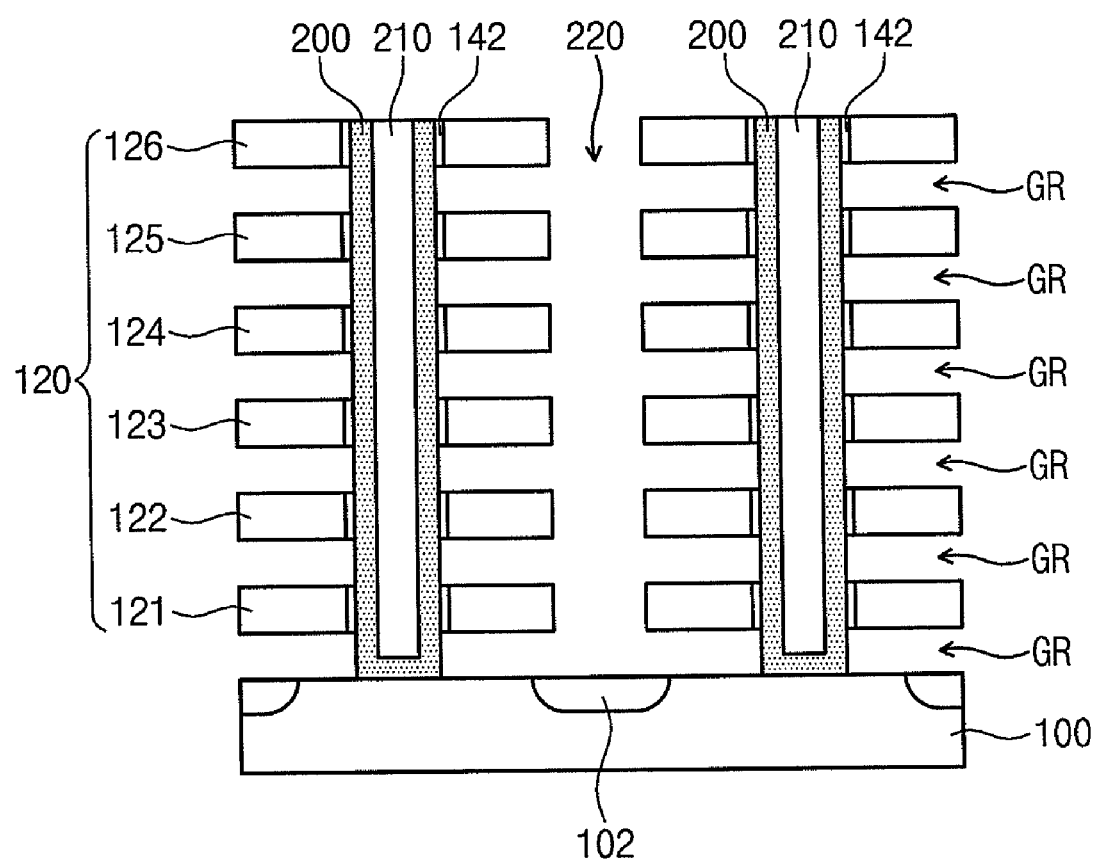

Referring to FIG. 9, the first material layers 111 to 116 exposed by the second opening 220 may be removed. Thus, gate regions GR may be formed between the stacked second material layers 121 and 126 to expose the sidewall of the semiconductor pattern 200.

Removal of the first material layer 111 to 116 may be performed using an etch recipe having etch selectivity with respect to the second material layers 121 to 126 and the semiconductor pattern 200. For example, the first material layers 111 to 116 may be removed using an etchant for a wet-etching of the first material layers 111 to 116. Removal of the first material layers 111 to 116 may be performed using either a dry-etching or a wet-etching, but may be performed by an isotropic etching.

When the first material layers 111 to 116 are removed, the fixed charge layer 142 contacting the semiconductor pattern 200 may also be removed by an over-etching. Thus, the fixed charge layers 142 may be formed between the semiconductor pattern 200 and the second material layers 121 to 126. On the other hand, when portions of semiconductor pattern 200 adjacent to the first material layers 111 to 116 are exposed by the isotropic etching process, a portion of the fixed charge layer 142 adjacent to the second material layers 121 to 126.

Figure 10:
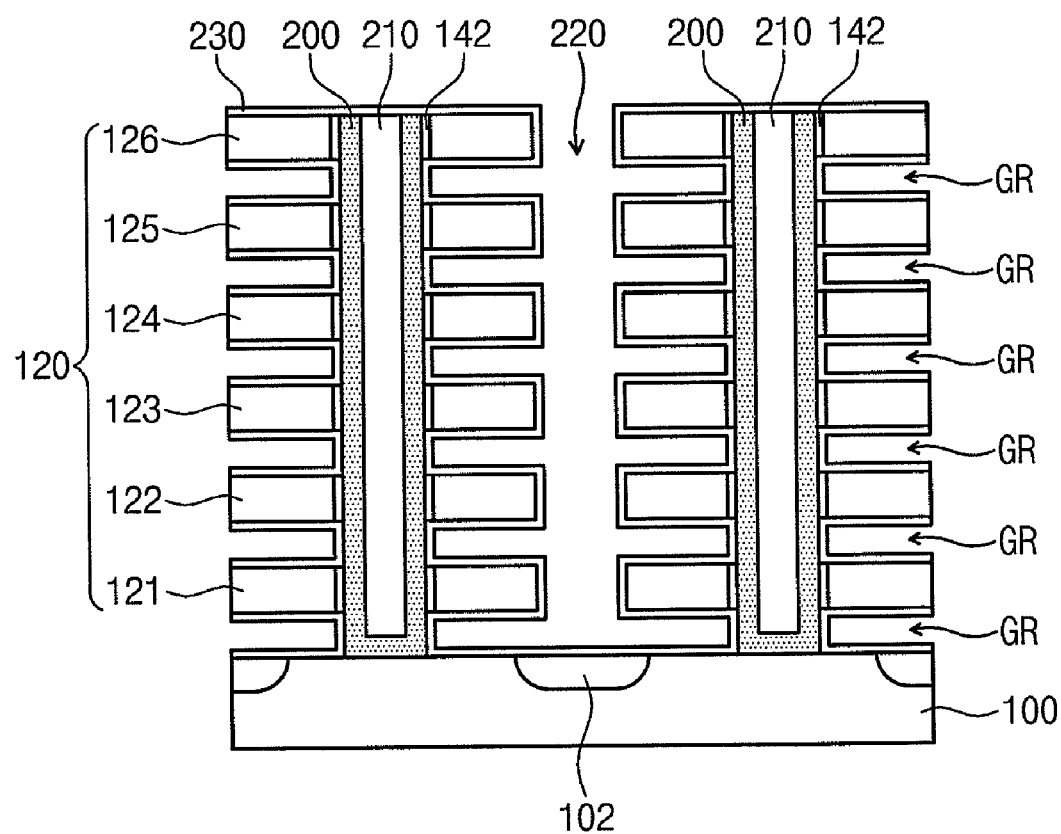

Referring to FIG. 10, the data storage layer 230 may be formed on a resulting structure in which the gate regions GR are formed.

The data storage layer 230 may be conformally formed along the surface of the thin film structure 120 in which the gate regions GR exposing portions of the sidewall of the semiconductor pattern 200 are formed. That is, the data storage layer 230 may be formed on the surface of the semiconductor pattern 200 exposed to the gate regions GR and the surface of the second material layers 121 to 126 exposed to the gate regions GR. When the semiconductor pattern 200 has a hollow cylindrical shape, the data storage layer 230 may be formed to surround the circumference of the semiconductor pattern 200.

The data storage layer 230 may include the charge tunneling layer 232, the charge storage layer 234, and the charge blocking layer 236 as described above. In such cases, the charge tunneling layer 232 may be formed to cover the sidewall of the semiconductor pattern 200 exposed by the gate region GR. The charge storage layer 234 and the charge blocking layer 236 may be sequentially formed on the charge tunneling layer. The charge tunneling layer 232, the charge storage layer 234, and the charge blocking layer 236 may be formed using a thin film formation method, e.g., CVD or ALD, which provides excellent step coverage. Since the sidewall of the semiconductor pattern 200 is exposed by the gate regions GR, the charge tunneling layer may be formed by directly performing a thermal oxidation process on the exposed surface of the semiconductor pattern 200.

For example, the charge tunneling layer 232 may be formed of silicon oxide (SiO2) and/or silicon oxynitride (SiON). The charge tunneling layer 232 may be formed of a complex layer in which a high dielectric material such as $Al_2O_3$, $HfO_2$ $ZrO_2$, $La_2O_3$, $Ta_2O_3$, $TiO_2$, $SrTiO_3$(STO), and/or $(Ba,Sr)TiO_3$(BST) and combination thereof are stacked. In such cases, the charge tunneling layer 232 may be formed of a material having a dielectric constant smaller than the charge blocking layer 236.

The charge storage layer 234 may include at least one of an insulating thin layer abundant in charge trap sites such as silicon nitride layer and/or silicon oxynitride, an insulating thin layer including nano dots, and a conductive thin layer that may be locally patterned to serve as a floating electrode.

For example, the charge blocking layer 236 may be formed of a complex layer in which a high dielectric material such as $Al_2O_3$, $HfO_2$ $ZrO_2$, $La_2O_3$, $Ta_2O_3$, $TiO_2$, $SrTiO_3$(STO), and/or $(Ba,Sr)TiO_3$(BST) and combination thereof are stacked. In such cases, the charge tunneling layer 232 may are stacked.

The data storage layer 230 is not limited to a thin layer for storing electric charges. The data storage layer 240 may be, e.g., a thin layer for a phase-change memory or a variable-resistance memory, capable of storing data using a different operating principle.

Figure 11:
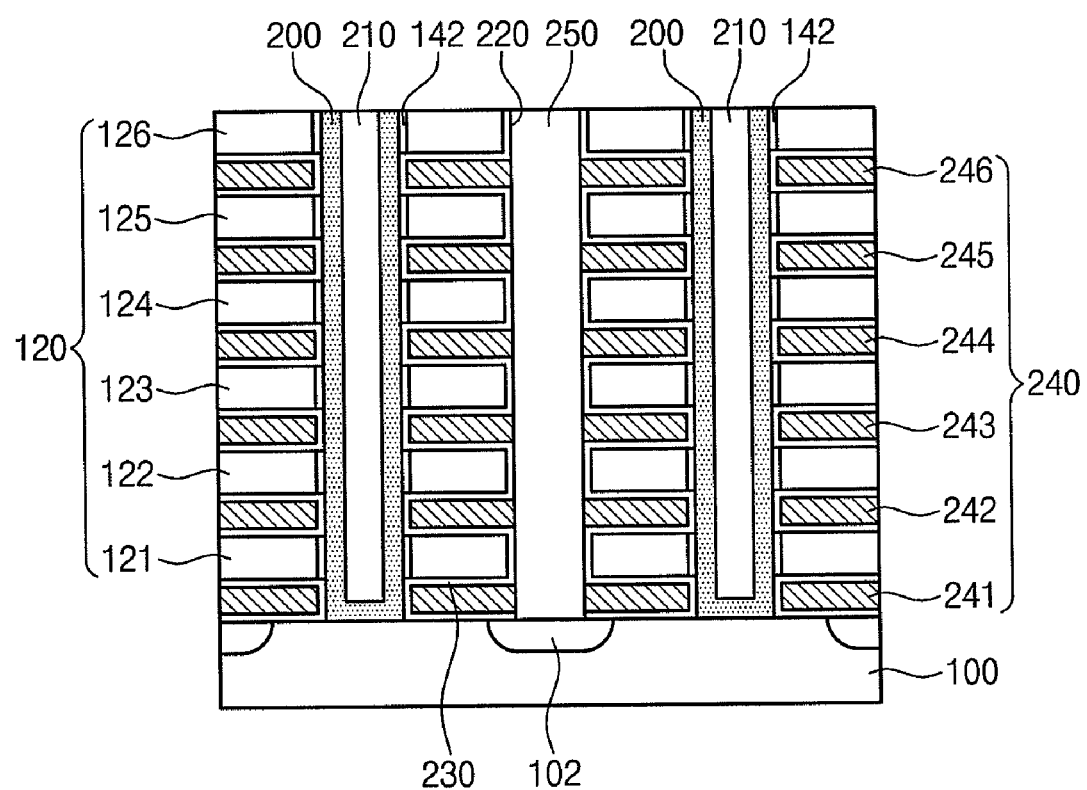

Referring to FIG. 11, the conductive patterns 241 to 246, hereinafter also referred to as gate electrodes 241 to 246, may be formed between the vertically stacked second material layers 121 to 126.

Specifically, forming the gate electrodes 241 to 246 may include forming gate regions GR on the resulting structure in which the data storage layer 230 is formed, depositing a gate conductive layer filling the gate regions GR and the second opening 220, and reforming the second opening 220 by patterning the gate conductive layer. Thus, the gate electrode structure 240 in which the gate electrodes 241 to 246 are vertically stacked may be formed on the semiconductor substrate 100.

Forming the gate conductive layer may be performed using thin layer formation technologies that provide excellent step coverage. The gate conductive layer may include polycrystalline silicon layer doped with impurities, silicide layers, (e.g., titanium silicide, cobalt silicide, and nickel silicide), metal layers (e.g., tungsten and copper), and/or metal nitride layers (e.g., titanium nitride and tantalum nitride).

Forming the second opening 220 may include forming a mask pattern (not shown) and anisotropically etching using the mask pattern as an etch mask. In such cases, the second opening 220 may be reformed to expose the data storage layer 230 on the sidewall of the second material layers 121 to 126 to form the electrically separated gate electrodes 241 to 246. The anisotropic etching of the gate conductive layer may be performed such that the data storage layer 230 on the sidewall of the second material layers 241 to 246 is also removed. Thus, the gate electrodes 241 to 246 may be locally formed between the second material layers 121 to 126 that are vertically adjacent to each other. The data storage layer 230 may also be locally formed between the second material layers 121 to 126.

As the second opening 220 is reformed, gate electrodes 241 to 246 having an independently linear shape may be formed between the second material layers 121 to 126. The gate electrodes 241 to 246 having the linear shape may be three-dimensionally disposed on the semiconductor substrate 100.

Next, the buried insulating layer 250 may be buried in the reformed second opening 220 to insulate the gate electrodes 241 to 246 that are horizontally adjacent to each other. That is, the buried insulating layer 250 having a sufficient thickness may be deposited to fill the reformed second opening 220, and may be planarized until an upper surface of the semiconductor pattern 200 is exposed.

Thereafter, the impurity region 202 may be formed on the semiconductor patterns 200 by ion-implanting impurities of an opposite type to the conductive type of the semiconductor pattern 200.

Figure 12:
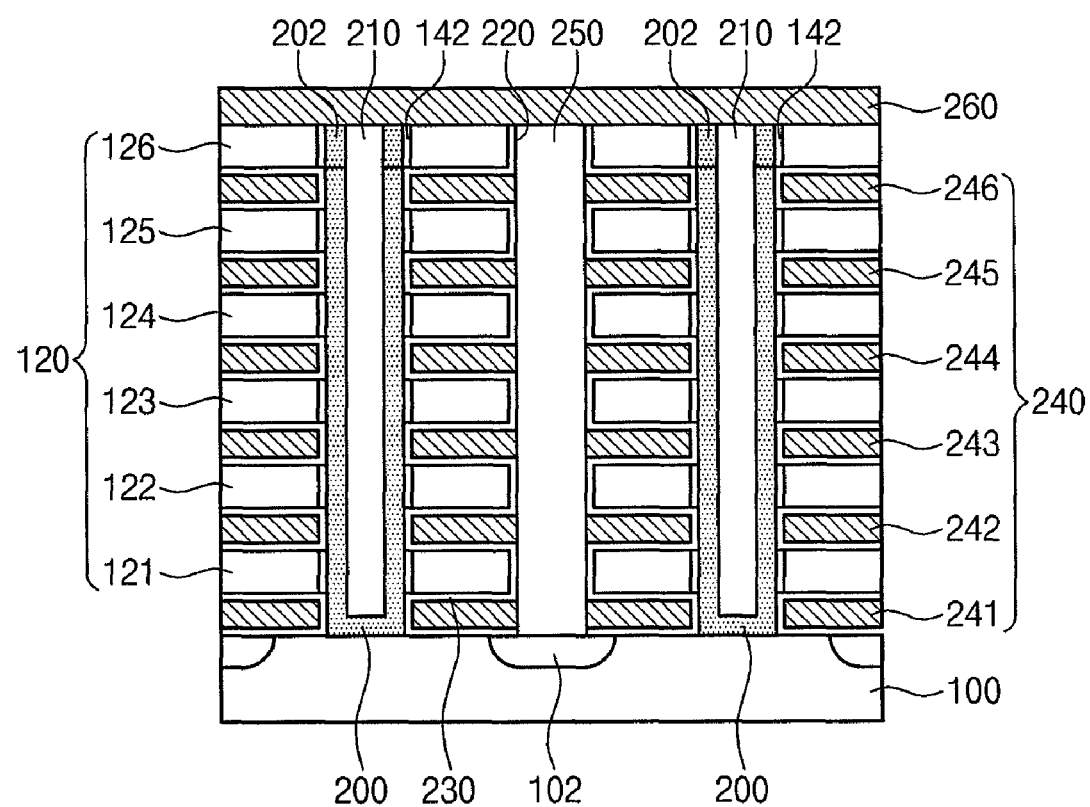

Referring to FIG. 12, the bit lines 260 may be formed to be connected to the semiconductor pattern 200.

The bit lines 260 may be formed to cross the gate electrodes 241 to 246 over the stack structure in which the gate electrodes 241 to 246 and the second material layers 121 to 126 are alternately stacked. The bit lines 260 may be electrically connected to the upper surfaces of the semiconductor patterns 200 through a direct contact or a contact plug (not shown).

The bit lines 260 may be formed by depositing a conductive layer on the stack structure in which the gate electrodes 241 to 246 and the second material layers 121 to 126 are alternately stacked and patterning the conductive layer in a linear form. The bit lines 260 may also be connected to the semiconductor pattern 200 through a direct contact or a contact plug.

As described above with regard to FIG. 5, when the first opening 130 is formed in a trench shape, the semiconductor layer in the first openings 130 may have a linear plane. In this case, the process of forming the semiconductor pattern 200 by patterning the semiconductor layer before the bit lines 260 are formed may be further included. That is, after the gate electrodes 241 to 246 are formed, a mask pattern crossing the gate electrodes 241 to 246 may be formed, and then the semiconductor layer in the first opening 130 may be etched using the mask pattern as an etch mask. Thus, the semiconductor patterns 200 that are spaced from each other may be formed in the first opening 130.

Figure 13:
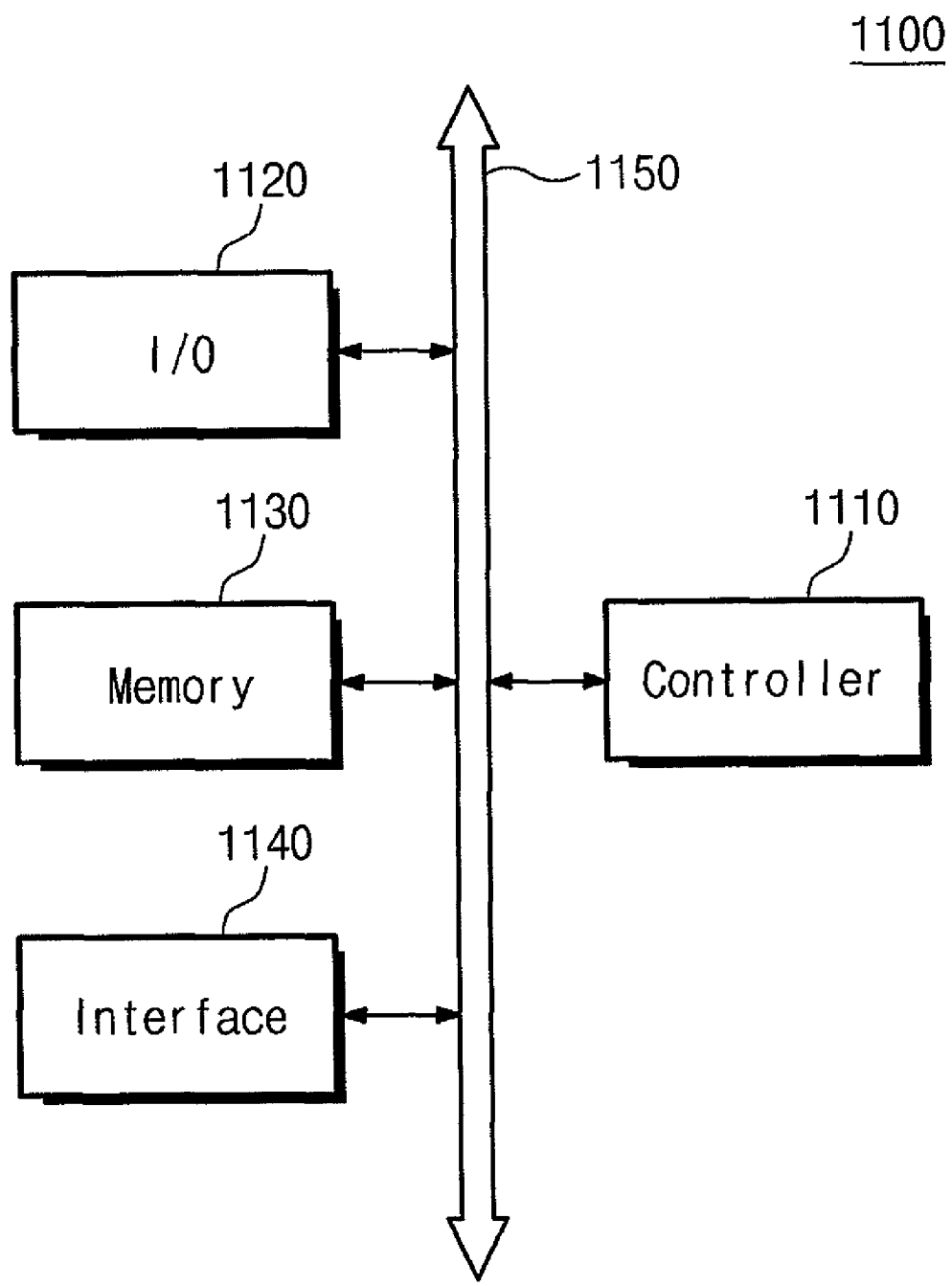
FIG. 13 illustrates a block diagram of an exemplary memory system including a nonvolatile memory device according to an embodiment.

FIG. 13 illustrates a block diagram of an exemplary memory system including a nonvolatile memory device according to an embodiment.

Referring to FIG. 13, a memory system 1100 may be applied to PDAs, portable computers, web tablets, wireless phones, mobile phones, digital music players, memory cards, or other devices capable of sending/receiving data in wireless environments.

The memory system 1100 may include a controller 1110, an input/output device 1120 such as keypad, keyboard, and display, a memory 1130, an interface 1140, and a bus 1150. The memory 1130 and the interface 1140 may communicate with each other through the bus 1150.

The controller 1110 may include one or more microprocessor, a digital signal processor, a microcontroller, or other similar processing devices. The memory 1130 may be used to store commands performed by the controller 1110. The input/output device 1120 may receive data or signals from the outside of the system 1100, or may send data or signals to the outside of the system 1100. For example, the input/output device 1120 may include a keyboard, a keypad, and a display device.

The memory 1130 may include nonvolatile memory devices according to embodiments. The memory 1130 may further include different memories, freely-accessible volatile memories, and other memories.

The interface 1140 may serve to send data to a communication network, or receive data from the communication network.

Figure 14:
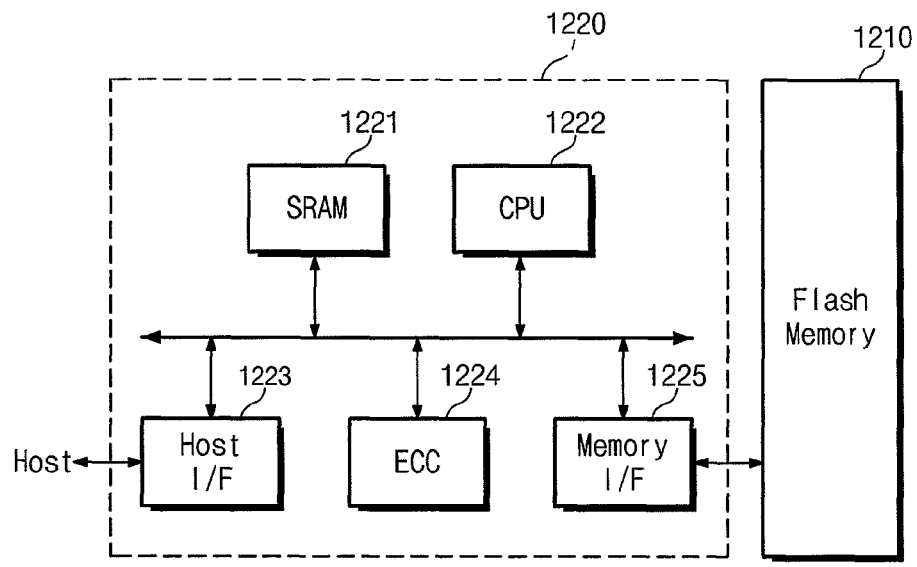
FIG. 14 illustrates a block diagram of an exemplary memory card including a nonvolatile memory device according to an embodiment.

FIG. 14 illustrates a block diagram of an exemplary memory card including a nonvolatile memory device according to an embodiment.

Referring to FIG. 14, a memory card 1200 for supporting high-capacity data storage may include a flash memory device 1210 according to an embodiment. The memory card 1200 may include a memory controller 1220 controlling overall data exchanges between a host and the flash memory device 1210.

An SRAM 1221 may be used as an operating memory of a processing unit 1222. A host interface 1223 may include a data exchange protocol of a host connected to the memory card 1200. An error correction block 1224 may detect and correct errors included in data read out from a multi-bit flash memory device 1210. A memory interface 1225 may interface with the flash memory device 1210. The processing unit 1222 may perform overall control operations of the memory controller 1220 for data exchanges. Although not shown, it will be apparent to persons skilled in the art that the memory card 1200 according to the embodiment may further include a ROM (not shown) for storing code data for interfacing with the host.

The flash memory device 1210 and the memory card 1200 or the memory system 1100 according to the embodiments may provide a highly-reliable memory system through the flash memory device 1210 in which erase characteristics of a dummy cell may be improved. Particularly, the flash memory device may be used in a memory system such as Solid State Disks (SSDs) that are widely used in recent years. In this case, read errors caused by the dummy cell can be blocked, thereby implementing highly-reliable memory systems.

Figure 15:
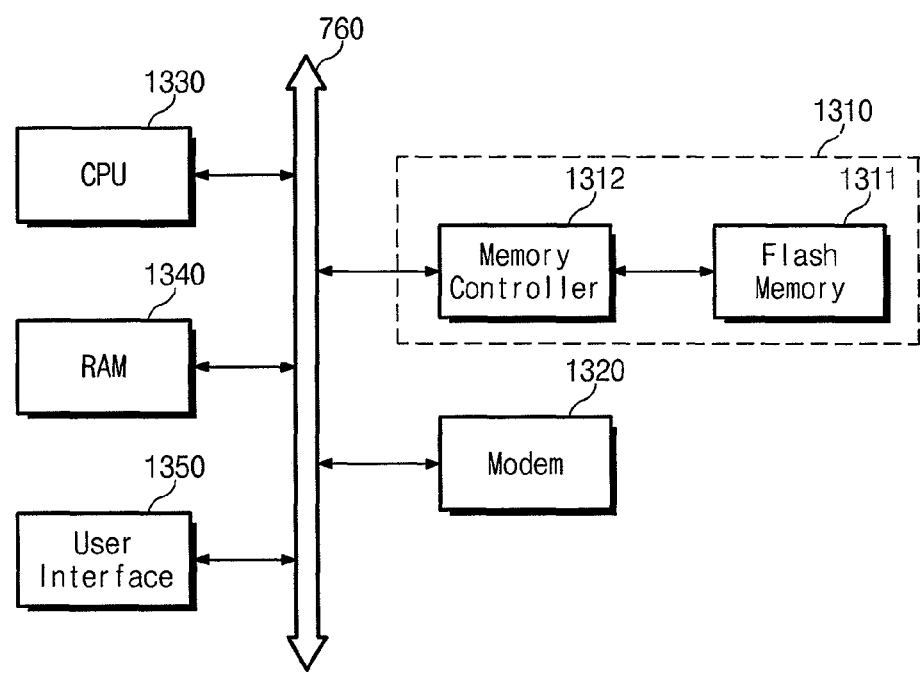
FIG. 15 illustrates a block diagram of an exemplary information processing system equipped with a nonvolatile memory device according to an embodiment.

FIG. 15 illustrates a block diagram of an exemplary information processing system equipped with a nonvolatile memory device according to an embodiment.

Referring to FIG. 15, a flash memory system 1310 may be mounted in an information processing system 1300 such as mobile devices or desktop computers. The information processing system 1300 may include a modem 1320, a central processing unit (CPU) 1330, a RAM 1340, and a user interface 1350. The flash memory system 1310 may be configured to be substantially identical to the memory system or the flash memory system described above. The flash memory system 1310 may store data process by the CPU 1330 or external data. Here, the flash memory system 1310 may be configured with an SSD. In this case, the information processing system 1300 may stably store large data in the flash memory system. With enhancement of reliability, the flash memory system 1310 may reduce resources necessary for the error correction, thereby providing the information processing system 1300 with a high-rate data transfer capability. Although not shown, it is apparent to those skilled in the art that the information processing system 1300 may further include application chipsets, camera image processors (CISs), and I/O devices.

A flash memory device or a memory system according to an embodiment may be mounted in various types of packages. Examples of the packages of the flash memory device or the memory system include Package on Package (PoP), Ball Grid Arrays (BGA), Chip Scale Packages (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

In a nonvolatile memory device and a method for fabricating the same according to an embodiment, since a channel connection region induced by a fixed charge layer is provided to the source/drain regions of memory cells having a vertical channel, the channel regions of the vertical adjacent memory cells may be inhibited from being electrically disconnected when the nonvolatile memory device is operated.

Also, the resistance of the source/drain region may be reduced in the memory cells. Thus, a current can be increased in the memory cells storing data.

In addition, due to an interaction between fixed charges in the fixed charge layer and charges stored in the charge storage layer, diffusion of the charges stored in the charge storage layer may be inhibited.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A nonvolatile memory device, comprising:
   a stacked structure on a semiconductor substrate, the stacked structure comprising conductive patterns and interlayer dielectric patterns alternately stacked therein;
   a semiconductor pattern connected to the semiconductor substrate by passing through the stacked structure;
   a data storage layer between the semiconductor pattern and the conductive patterns; and
   a fixed charge layer between the semiconductor pattern and the interlayer dielectric patterns, the fixed charge layer including fixed charges,
   wherein electrical polarity of the fixed charges is equal to electrical polarity of majority carriers of the semiconductor pattern.

2. The nonvolatile memory device as claimed in claim 1, wherein the semiconductor pattern includes a p-type semiconductor material, and the fixed charge layer includes elements generating positive fixed charges.

3. The nonvolatile memory device as claimed in claim 2, wherein the elements generating the positive fixed charges include nitrogen (N), hydrogen (H), hafnium (HF), and/or zirconium (Zr).

4. The nonvolatile memory device as claimed in claim 2, wherein the fixed charge layer includes silicon nitride (SiN), silicon oxynitride (SiON), hafnium oxide, and/or zirconium oxide.

5. The nonvolatile memory device as claimed in claim 1, wherein the semiconductor pattern includes an n-type semiconductor material, and the fixed charge layer includes elements generating negative fixed charges.

6. The nonvolatile memory device as claimed in claim 5, wherein the elements generating the negative fixed charges includes fluorine (F) and/or aluminum (Al).

7. The nonvolatile memory device as claimed in claim 5, wherein the fixed charge layer includes aluminum oxide and/or aluminum oxynitride.

8. The nonvolatile memory device as claimed in claim 1, wherein the semiconductor pattern includes a channel region adjacent to the conductive pattern and a channel connection region adjacent to the fixed charge layer, and a number of majority carriers in the channel connection region is smaller than a number of majority carriers in the channel region.

9. The nonvolatile memory device as claimed in claim 1, wherein the data storage layer extends on top surfaces and bottom surfaces of the conductive pattern.

10. The nonvolatile memory device as claimed in claim 1, wherein the interlayer dielectric patterns include an insulating material having a dielectric constant smaller than a dielectric constant of a material of the fixed charge layer.

* * * * *